United States Patent
Watanabe et al.

(10) Patent No.: US 6,788,561 B2
(45) Date of Patent: Sep. 7, 2004

(54) SEMICONDUCTOR INTEGRATED CIRCUIT DEVICE WITH REDUCED COUPLING NOISE

(75) Inventors: Noriyoshi Watanabe, Chitose (JP); Kazutomo Ogura, Chitose (JP); Kiyotada Funane, Chitose (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 34 days.

(21) Appl. No.: 10/135,505

(22) Filed: May 1, 2002

(65) Prior Publication Data

US 2002/0195678 A1 Dec. 26, 2002

(30) Foreign Application Priority Data

Jun. 22, 2001 (JP) ........................................ 2001-189140

(51) Int. Cl.$^7$ ................................................. G11C 5/06
(52) U.S. Cl. .......................... 365/63; 365/194; 365/205
(58) Field of Search ........................... 365/194, 63, 51, 365/205, 189.01

(56) References Cited

U.S. PATENT DOCUMENTS

| | | | | |
|---|---|---|---|---|
| 5,650,975 A | * | 7/1997 | Hamade et al. | ........ 365/230.01 |
| 6,091,629 A | * | 7/2000 | Osada et al. | ................. 365/156 |
| 6,377,483 B1 | * | 4/2002 | Arimoto et al. | ............ 365/149 |
| 6,424,554 B1 | * | 7/2002 | Kawasumi | .................... 365/63 |

FOREIGN PATENT DOCUMENTS

JP 8-125130 5/1996

* cited by examiner

*Primary Examiner*—Son T. Dinh
(74) *Attorney, Agent, or Firm*—Miles & Stockbridge P.C.

(57) ABSTRACT

To a first signal line to which a signal with a comparable small amplitude against the power supply voltage is transmitted at a first timing, a second signal line to which a voltage maintained at a constant is transmitted at the first timing is laid out on the same wiring layer as that of the first signal line adjacently to each other. Thereby, the invention reduces the coupling noises without impairing a high density of the signal wirings, and provides a semiconductor integrated circuit device with a memory circuit that realizes a high integration, low power consumption, and high speed.

16 Claims, 9 Drawing Sheets

SEMICONDUCTOR INTEGRATED CIRCUIT DEVICE WITH REDUCED COUPLING NOISE

TECHNICAL FIELD

The present invention relates to a semiconductor integrated circuit device, specifically to a technique effective for use in a device with a static type high-speed memory.

BACKGROUND OF THE INVENTION

Accompanied with progress in the micro fabrication of a semiconductor integrated circuit device, decrease in the spacing between adjoining wirings and thickening in the wiring layer have been creating a malfunction of coupling noises in the semiconductor integrated circuit device, resulting from a capacitance between the adjoining wirings in the same wiring layer. In order to reduce such coupling noises in the highly dense wirings, generally a shield wiring has been laid out to a signal wiring that receives the noises. In reverse to this, the Japanese Patent Application Laid-Open No. Hei 8(1996)125130 discloses a technique that disposes a wiring fixed to the ground potential of a circuit and a wiring fixed to the power supply potential to come close to a signal wiring regarded as a noise source less than virtually the thickness of an interlayer insulation film, and terminate the line of electric force from the signal wiring to the ground wiring or the power supply wiring to thereby reduce the influence to the other signal wirings.

SUMMARY OF THE INVENTION

As mentioned above, in either of the technique to reduce the coupling noises, which lays out the shield wiring to the signal wiring that receives the noises, or the technique disclosed in the publication, the common concept is to dispose a shield wiring to a signal transmission wiring, or in reverse to dispose a power supply wiring and a ground wiring that terminate the line of electric force to the signal wiring of the noise sources. That is, the conventional coupling noise reduction technique involves increase of the number of wirings for reducing the noises, which leads to an evil influence that substantially impairs the high-density wirings, and has incompatibility with the high-density wirings that cause the coupling noises.

The present invention has been made in view of the foregoing circumstances, and an object of the invention is to provide a semiconductor integrated circuit device that achieves reduction of the coupling noises without harming a high density of signal wirings. Another object of the invention is to provide a semiconductor integrated circuit device with memory circuits that realizes a high integration and low power consumption and high speed. The above and other objects and novel features of the invention will become apparent from the descriptions of this specification and accompanying drawings thereof.

The outline of the typical aspects of the invention disclosed here is as follows. That is, to a first signal line to which a signal with a comparably small amplitude against a power supply voltage is transmitted at a first timing, a latch type amplifier is connected which amplifies the small amplitude signal into a signal amplitude corresponding to the power supply voltage and the ground potential of the circuit, and a second signal line to which a voltage maintained at a constant is transmitted at the first timing is laid out on the same wiring layer as that of the first signal line adjacently to each other.

DETAILED DESCRIPTION OF THE PREFERRED EMBODIMENTS

Figure 1:
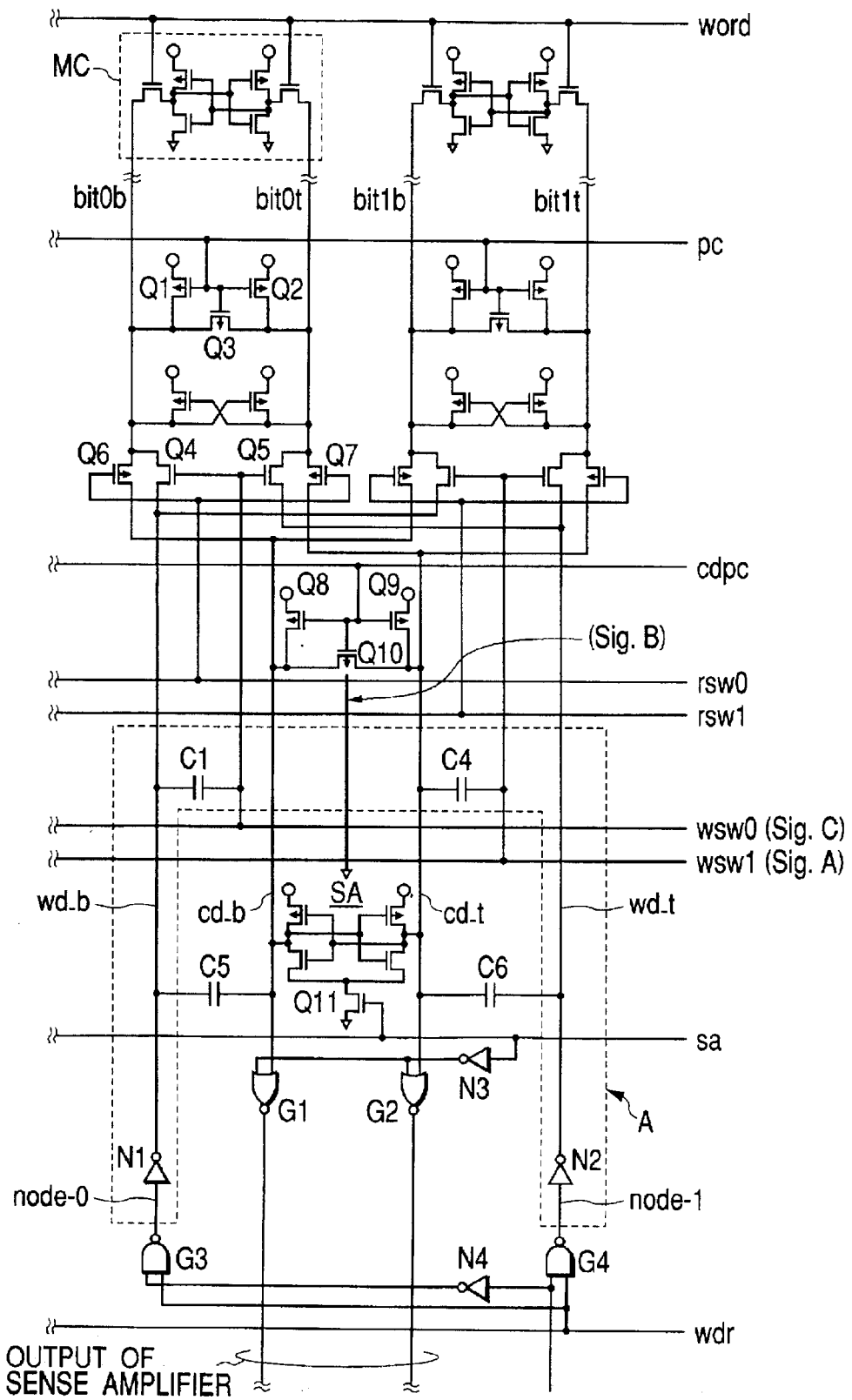
FIG. 1 is a circuit diagram of a major part that illustrates one embodiment of a static type RAM to which the invention is applied.

FIG. 1 illustrates a major circuit part of a static type RAM (Random Access Memory) of one embodiment to which the invention is applied. The static type RAM of the embodiment is regarded as suitable for an address array (or cache tag) in the cache memory, which is not especially restricted. The drawing typically illustrates two complementary bit line pairs, one word line, two memory cells provided on the intersections of these lines, and input/output selection circuits thereof and a sense amplifier. In the drawing, P-channel MOSFET (Metal-Oxide-Semiconductor-Field-Effect-Transistor) is different from the N-channel MOSFET in that a line or an arrow facing in the vertical direction to the gate electrode to the channel portion thereof is added. In the present embodiment, the so-called MOSFET is used instead of an MISFET (Metal-Insulator-Semiconductor-Field-Effect-Transistor).

The memory cell MC uses a latch circuit in which the input and the output of two CMOS (Complementary-MOS) inverters comprised of the P-channel MOSFETs and the N-channel MOSFETs are cross-connected to each other. N-channel type transfer gate MOSFETs are provided between a pair of input/output nodes of the latch circuit and the complementary bit line pair bit0$b$ and bit0$t$ for selecting a memory cell so as to electrically connect therebetween. The gates of the transfer gate MOSFETs are electrically connected to the word line. The memory cell provided on the other complementary bit line pair bit1$b$ and bit1$t$ is also configured with the same CMOS static type memory cell as above. Here, the last letter b of the bit0$b$ represents a bar signal (inverted signal) that the low level corresponds to the logic 1, and the last letter t of the bit0$t$ represents a true signal (non-inverted signal) that the high level corresponds to the logic 1.

The complementary bit line pair bit0$b$ and bit0$t$ are provided with P-channel type pre-charge MOSFETs Q1, Q2. The gates of the MOSFETs Q1, Q2 are supplied with a pre-charge signal pc. Between the complementary bit line pair bit0*b* and bit0*t* is inserted a P-channel MOSFET Q3 for equalization that receives the pre-charge signal pc. Also, the complementary bit line pair bit1*b* and bit1*t* are provided with the same P-channel type pre-charge MOSFETs and the P-channel type MOSFET for equalization.

The one complementary bit line pair bit0*b* and bit0*t* of the two complementary bit line pairs are connected to data line pair cd_b and cd_t for reading through P-channel type switch MOSFETs Q6 and Q7. The other complementary bit line pair bit1*b* and bit1*t* of the two complementary bit line pairs are also connected to the data line pair cd_b and cd_t for reading through P-channel type switch MOSFETs same as above. The gates of the MOSFETs Q6 and Q7 are supplied with a read select signal rsw0. The gates of the P-channel MOSFETs same as above are supplied with a read select signal rsw1

One sense amplifier SA is provided for these complementary data line pairs cd_b and cd_t for reading. The sense amplifier SA is provided with a switch MOSFET Q11, to the gate of which is supplied a sense amplifier activation signal sa. The sense amplifier activation signal sa turns the MOSFET Q11 ON, whereby either of the complementary bit line pairs are connected to the data line pair cd_b and cd_t for reading, when the sense amplifier SA starts the operation.

The data lines cd_b and cd_t for reading are connected to the input/output nodes of the sense amplifier SA including the CMOS latch circuit. The sense amplifier SA takes on a latch circuit in which the input and the output of two CMOS inverters composed of the P-channel MOSFETs and the N-channel MOSFETs are cross-connected to each other. The sources of the P-channel MOSFETs are supplied with the operational voltage, and the sources of the N-channel MOSFETs are supplied with the ground potential of the circuit through the N-channel type switch MOSFET Q11.

A P-channel type MOSFET Q10 for equalization is provided between the data lines cd_b and cd_t for reading that are the input/output nodes of the sense amplifier SA. Between each of the data lines cd_b and cd_t for reading and the operational voltage are provided P-channel type MOSFETs Q8, Q9 for pre-charging. The gates of these MOSFETs Q8 through Q10 are supplied with a pre-charge signal cdpc.

The sense amplifier SA of this embodiment is configured with a latch circuit having the positive feedback loop with a high sensitivity. When the sense amplifier SA is supplied with the pre-charge voltage having the level equalized by the ON state of the equalizing MOSFET Q10 before starting the operation by the signal sa, and the potential difference of the data lines cd_b and cd_t for reading is brought into a specific potential difference according to the stored information from a selected memory cell, the sense amplifier SA brings the MOSFET Q11 into the ON state by means of the signal sa, and amplifies the specific potential difference to bring the data lines cd_b and cd_t for reading into the high and low level states. Since the sense amplifier in this embodiment is designed to perform a high-sensitive sensing operation, the specific potential may take a signal with an extremely small amplitude in comparison with a signal amplitude corresponding to the power supply voltage or the operational voltage and the ground potential of the circuit.

For a high-speed amplifying operation, the data lines cd_b and cd_t for reading are made to cut off the complementary bit lines bit0*b* and bit 0*t* or the complementary bit lines bit1*b* and bit1*t* in correspondence with the high level of the signal sa. That is, the complementary bit line pair bit0*b* and bit 0*t* or the complementary bit line pair bit1*b* and bit1*t* that have large parasitic capacitances by a large number of the memory cells being connected are disconnected with the data lines cd_b and cd_t for reading, and with the data lines cd_b and cd_t for reading as the load of the sense amplifier SA, such a fine potential difference of the data lines cd_b and cd_t for reading is transformed with a high speed into an amplified signal of the high level and low level in correspondence with the power supply voltage and the ground potential of the circuit.

With the sense amplifier SA having the foregoing CMOS latch configuration, the aforementioned amplifying operation utilizing the positive feedback loop transforms the potential difference between the data lines cd_b and cd_t for reading into the high level/low level, and the CMOS latch circuit impedes a stationary flow of a direct current, thereby achieving the low power consumption. Although not restricted, the amplified output of the sense amplifier is transmitted to a comparison circuit not illustrated in case of the cache tag for example, through NOR gates G1, G2 whose gates are controlled by a signal that an inverter circuit N3 receiving the sense activation signal sa forms. The comparison circuit not illustrated compares data lines wd_b and wd_t for writing, which will be explained next, and determines the coincidence/non-coincidence thereof.

The data lines wd_b and wd_t for writing are extended in parallel with the data lines cd_b and cd_t for reading. The one complementary bit line pair bit0*b* and bit0*t* of the two complementary bit line pairs are connected to data line pair wd_b and wd_t for writing through N-channel type switch MOSFETs Q4 and Q5. The other complementary bit line pair bit1*b* and bit1*t* of the two complementary bit line pairs are also connected to the data line pair wd_b and wd_t for writing through N-channel type switch MOSFETs same as above. The gates of the switch MOSFETs Q4 and Q5 are supplied with a write select signal wsw0, and the gates of the N-channel type switch MOSFETs same as above are supplied with a write select signal wsw1.

A write amplifier composed of the inverter circuits N1, N2 is provided for the data line pair wd_b and wd_t for writing. A write signal is transmitted to the inputs of the inverter circuits N1, N2 constituting the write amplifier through NAND gate circuits G3, G4. The gates of the NAND gate circuits G3 and G4 are controlled by a write control signal wdr. The write signal is supplied to the gate circuit G4 and the write signal inverted through an inverter circuit N4 is supplied to the other gate circuit G3.

The operation of the cache tag in this embodiment attains a read operation of memory cells within one cycle of a clock signal, a comparison operation with input data and a comparison result thereof, and completes a selective write operation to the memory cell corresponding to the comparison result. In other words, the use of the address array or the cache tag of the cache memory in this embodiment enables the central processing unit to make a swifter determination whether to fetch data read out from the cache data memory having been selected in parallel, or to make an access to the main memory, thus achieving a high-speed data processing. Alternatively, it will shorten the cycle of the clock signal.

FIG. 1 is to express the circuit, and the layouts of the wirings and the like do not necessarily correspond with those of the circuit elements and wirings formed on a semiconductor substrate; however, they are illustrated in a similar form to the actual layout of the circuit in order to make an easy understanding of the present invention. The wirings in connection with the coupling noise reduction technique relating to the invention are the data lines cd_b and cd_t for reading, the data lines wd_b and wd_t for writing, and column selection lines wsw0 and wsw1 for writing. And, although not restricted especially, between the data lines cd_b and cd_t for reading is provided a dummy line (Sig. B) to which the ground potential of the circuit is given.

Figure 2:
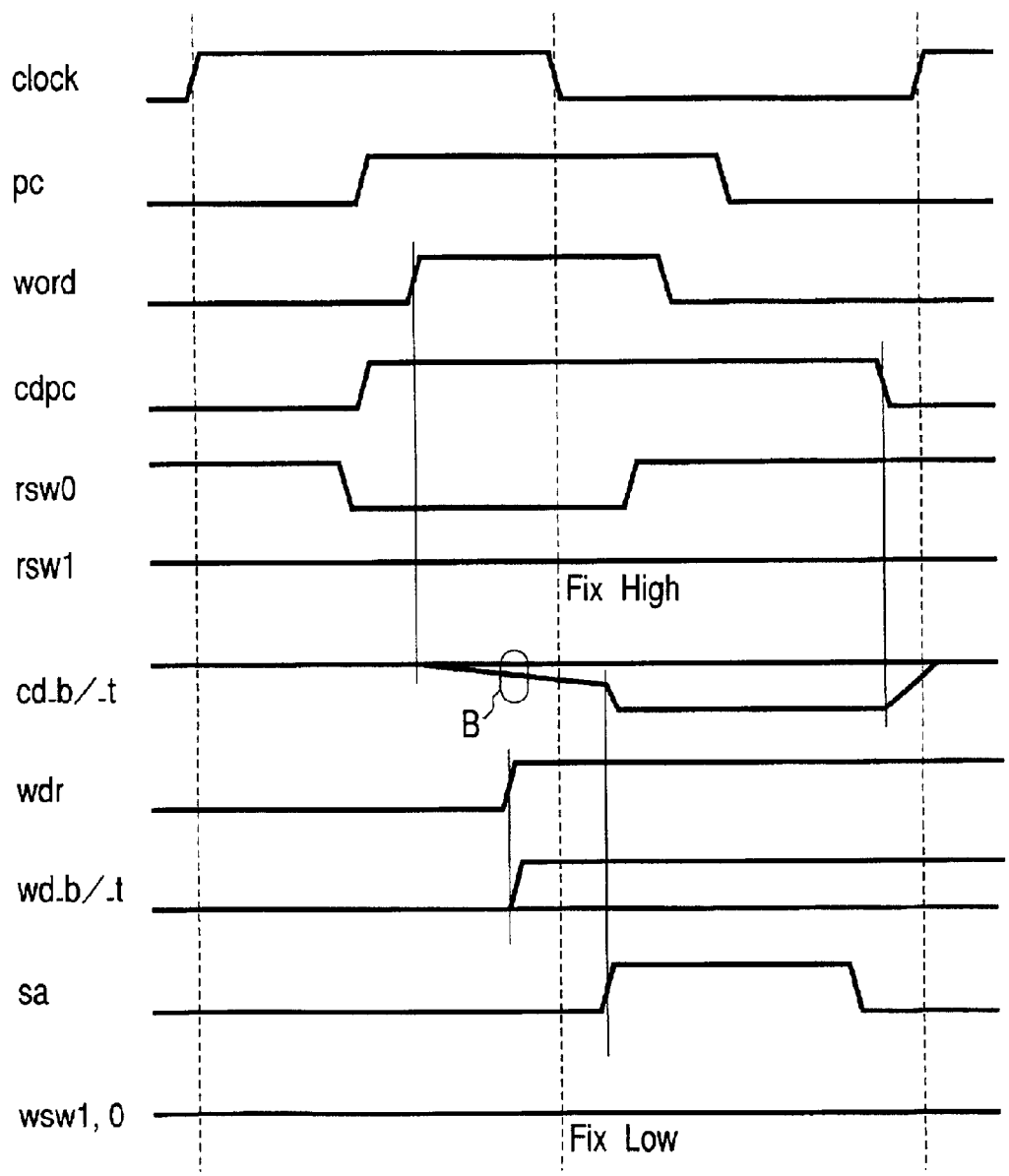
FIG. 2 is a timing chart explaining an operation of the static type RAM illustrated in FIG. 1.

FIG. 2 illustrates a timing chart that explains one example of an operation of the static type RAM shown in FIG. 1. In the first half period in which the clock signal clock takes the high level, the control signal cdpc is brought to the low level from the previous cycle, and the pre-charge and equalization are applied to the data lines cd_b and cd_t for reading. In the same manner, the pre-charge and equalization are also applied to the complementary bit lines not illustrated, by means of the low level of the signal pc.

The control signals cdpc and pc are turned to the high level, and the pre-charge and equalization to the data lines cd_b and cd_t for reading and the complementary bit line pair bitt/bitb are completed. And, the input of the address signal not illustrated turns the column selection signal rsw0, for example, to the low level, whereby the complementary bit line pair bit0b, bit0t on the selection side is connected to the data line pair cd_b, cd_t for reading.

In replacement of this configuration, it may be arranged that the column selection signals rsw0 and rsw1 are set to the low level during the pre-charge period, and the column selection signal rsw1 that is turned to the non-selection side by the address input is set to the high level to be cut off from the data lines cd_b and cd_t for reading. Thus, the pre-charge operation is performed in a state that the complementary bit line pairs bit0b, bit0t and bit0b, bit0t and the data line pair cd_b, cd_t for reading are connected, and this pre-charge operation is advantageous in setting the pre-charge voltage equally each other.

Thereafter, the word line word is turned to the high level of the selection level, the complementary bit lines bit0b/bit0t and the data lines cd_b, cd_t for reading that are coupled with them receive readout signals according to the stored information of a selected memory cell. When the potential difference between the readout signals received by the data lines cd_b, cd_t for reading comes to a signal level required for the operation of the sense amplifier, the signal sa comes to the high level and the sense amplifier starts the amplifying operation. In correspondence with the high level of the signal sa, the column selection signal rsw0 is turned to the high level to bring the P-channel type switch MOSFETs Q6, Q7 into the OFF state, whereby the complementary bit lines bit0t/bit0b and the data lines cd_b, cd_t for reading are electrically separated.

In correspondence with the start of the amplifying operation of the sense amplifier, by means of the above electrical separation of the complementary bit lines bit0t/bit0b from the data lines cd_b, cd_t for reading, the load of the sense amplifier is reduced to only the parasitic capacitances of the data lines cd_b, cd_t for reading, and a fine potential difference of the data lines cd_b, cd_t for reading synergizes with the positive feedback operation of the sense amplifier to rapidly expand to the high level/low level.

In this embodiment, the foregoing selection operation of the word line word turns the write control signal wdr into the high level, at the timing that the stored information of a memory cell is transmitted through the complementary bit lines bit0t/bit0b to the data lines cd_b, cd_t for reading, that is, at the timing that only a fine potential difference is generated to the data lines cd_b, cd_t for reading, and the write signal corresponding to the address input is transmitted to the data lines wd_b and wd_t for writing, whereby the noise generating point is to be determined.

When the gates of the gate circuits G1, G2 are opened by the high level of the signal sa, the foregoing readout signals output the stored information of the memory cell to the comparison circuit not illustrated. At this moment, a write signal being one of data to be compared has already been transmitted to the comparison circuit, and the determination operation of coincidence/non-coincidence is started in correspondence with the output signal from the sense amplifier. If the comparison output shows non-coincidence, the signal wsw0 is generated, and the write signals on the data lines wd_b and wd_t for writing are transmitted to the complementary bit lines bit0t and bit0b and are immediately written into the memory cell. If all the bits corresponding to the address tag are coincident, it is judged as cache hit, and the above writing is not performed.

The memory circuit of this embodiment mainly performs the pre-charge and equalization of the data lines cd_b, cd_t for reading, and the input of write data and the selection of word lines, in the first half period in which the clock signal clock assumes the high level; and in the latter half period in which the clock signal clock assumes the low level, it mainly performs the activation and comparison of the sense amplifier, the writing of memory cells carried out as required, the reset of the word lines, and the pre-charge and equalization of the complementary bit line pair bit0t/bit0b.

Thus, the memory circuit of this embodiment is able to carry out, in one cycle of the clock signal clock, a reading of a memory cell and a comparison with an input data, to obtain a comparison result thereof, and to complete a selective writing into a memory cell corresponding to the comparison result thereof. Accordingly, the application of the memory circuit of this embodiment to the address array of the cache memory or the cache tag permits the central processing unit to make a swifter determination to fetch data being read out from the cache data memory being selected in parallel, or to execute an access to the main memory, whereby the data processing speed can be accelerated. Or, it will shorten the cycle of the clock signal clock.

Figure 3:
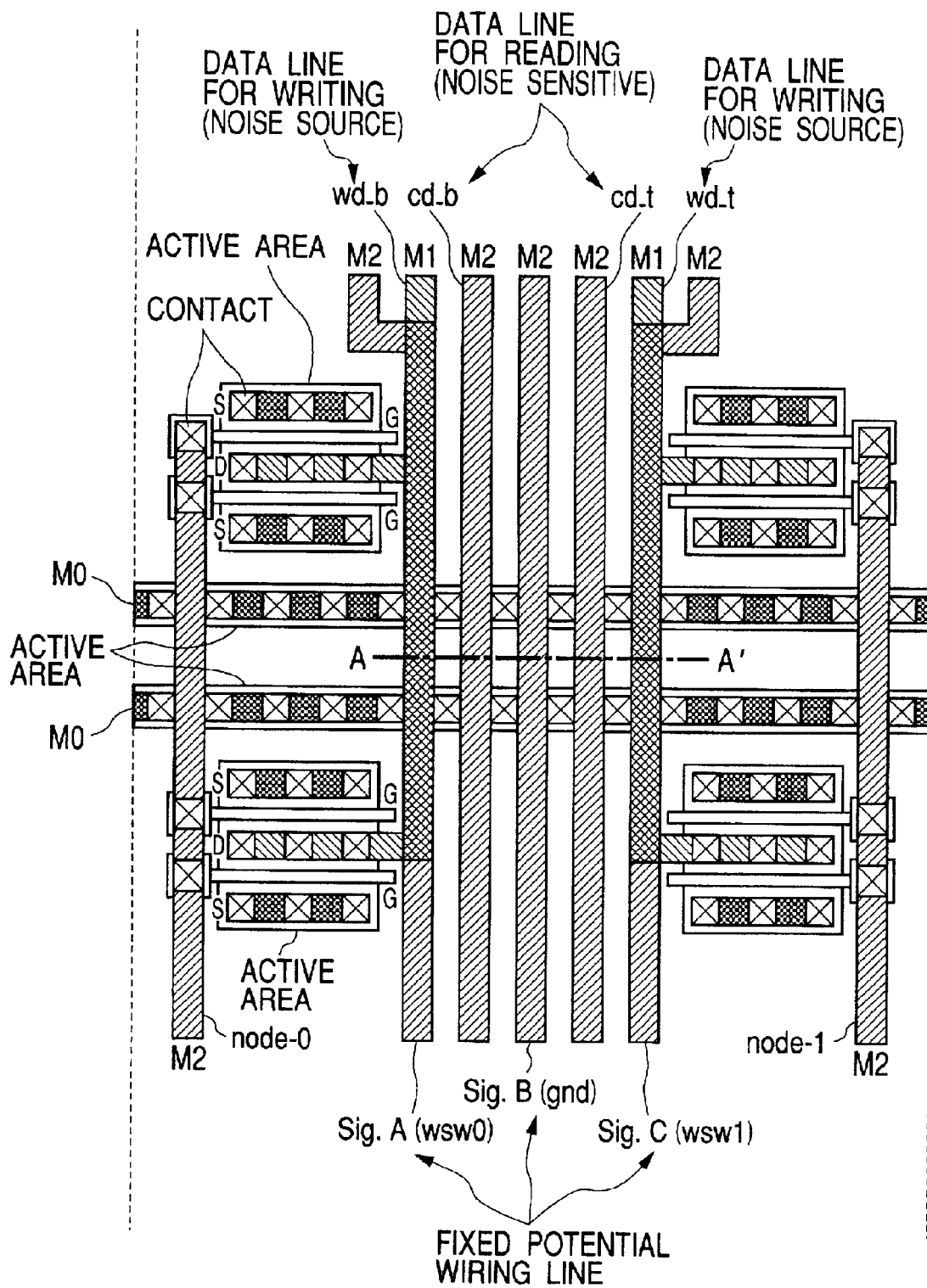
FIG. 3 is a layout chart of one embodiment corresponding to FIG. 1.

FIG. 3 illustrates the actual layout of the embodiment corresponding to FIG. 1. In the drawing, the area A surrounded by the dotted lines is extracted. That is, the drawing illustrates the layout of the inverter circuits N1, N2 as the write amplifiers and the wiring patterns in conjunction with them.

The write signals on the data lines wd_b and wd_t driven by the inverter circuits N1, N2 as the write amplifiers are formed into the signals with the maximum amplitude corresponding to the power supply voltage and the ground potential of the circuit, in order for the write operation into the memory cells. On the other hand, the substantial read signals transmitted to the data lines cd_b, cd_t for reading are the fine signals as mentioned above. Both are the wirings to be connected to the bit lines bitb/bitt that are laid out in a high density, and they are necessarily laid out adjacently.

Besides, in order to achieve a high-speed operation, the write signals with the maximum amplitude are transmitted to the data lines wd_b and wd_t for writing, at the same timing (time zone) that the fine signals are transmitted to the data lines cd_b, cd_t for reading from the memory cells. Thereby, the noise creation point B shown in FIG. 2 will emerge at the worst timing. The simplest method to carry out the noise reduction is to delay the input timing of the write signals, however this method sacrifices the comparison operation together with the reading of the sense amplifier, which results in a great loss of the operation speed. In this embodiment, the coupling noise reduction is designed without sacrificing the operation speed as above, or without sacrificing a high integration of the signal wirings, as the conventional technique adds the dummy lines for noise reduction.

In FIG. 3, the two active areas horizontally extended in parallel are to supply well voltages to the N-type well and P-type well where the P-channel type MOSFETs and the N-channel type MOSFETs constituting the inverter circuits N1, N2 are formed, and they are provided with contacts and receive the power feeding through the wiring M0 of a metal 0 layer. The metal 0 layer wiring M0 is a wiring layer having tungsten as the principal constituent, which is not limited. The metal wirings M1, M2, and the like formed to overlie the metal 0 layer are the wirings with aluminum as the principal constituent.

The foregoing MOSFETs are laid out to split into right and left in correspondence with the two inverter circuits N1 and N2, in which the upper sides are the P-channel type MOSFETs and the lower sides are the N-channel type MOSFETs. In these MOSFETs, the two gates are provided in parallel to sandwich the drain D being the output node, and the uppermost and lowermost diffusion layers are the sources S. The gate electrodes are provided with the input nodes node-0 and node-1 to correspond with the two inverter circuits N1 and N2, by means of the wiring layers M2 of the second layer that are vertically extended on the right and left outsides.

The output nodes of the inverter circuits N1 and N2 are connected to the wiring layers M1 as the first layer. The wiring layers M1 as the first layer constitute the data lines wd_b and wd_t for writing, which are extended vertically along the insides of the MOSFETs. In order to reduce the coupling noises from the data lines wd_b and wd_t for writing, this embodiment allocates the column selection signal lines wsw1, wsw0 for writing to the wiring layers M2 of the second layer that overlie the data lines wd_b and wd_t for writing with intervention of an interlayer insulating film.

The data lines cd_b and cd_t for reading are laid out adjacently to the insides of the column selection signal lines wsw1 (Sig. A), wsw0 (Sig. C), by means of the wiring layers M2 of the second layer. Further, between the data lines cd_b and cd_t for reading is laid out the dummy line Sig. B composed of the wiring layers M2 of the second layer to which the fixed voltage of the ground potential gnd is given, which is not especially limited.

As mentioned above, the data lines wd_b and wd_t for writing are laid out outside the data lines cd_b and cd_t for reading. That is, the data line wd_b for writing is laid out on the left of the data line cd_b for reading in parallel therewith, and the data line wd_t for writing is laid out on the right of the data line cd_t for reading in parallel therewith. And, on the outsides thereof are laid out the inverter circuits N1 and N2 for writing and the input signal lines node-0 and node-1, whereby the maximum width of the circuit area is determined. The aforementioned comparison circuits, gate circuits, sense amplifiers, and column switches are formed.

The memory mat includes two pairs of the complementary bit lines bit0b/bit0t and bit1b/bit1t. The memory cell MC mainly performs the storage operation, and small sized elements are used to attain a large storage capacity with a small area. In contrast to this, the MOSFETs constituting a sense amplifier or a write amplifier, which perform a high-speed amplifying operation with a high sensitivity, take a comparably large element size. Therefore, the two complementary bit line pairs bit0b/bit0t and bit1b/bit1t are allocated to a repeated pitch of the circuits where one sense amplifier and the writing and reading data lines are allocated as above, and thereby these circuits can be coordinated with a high density.

Figure 4:
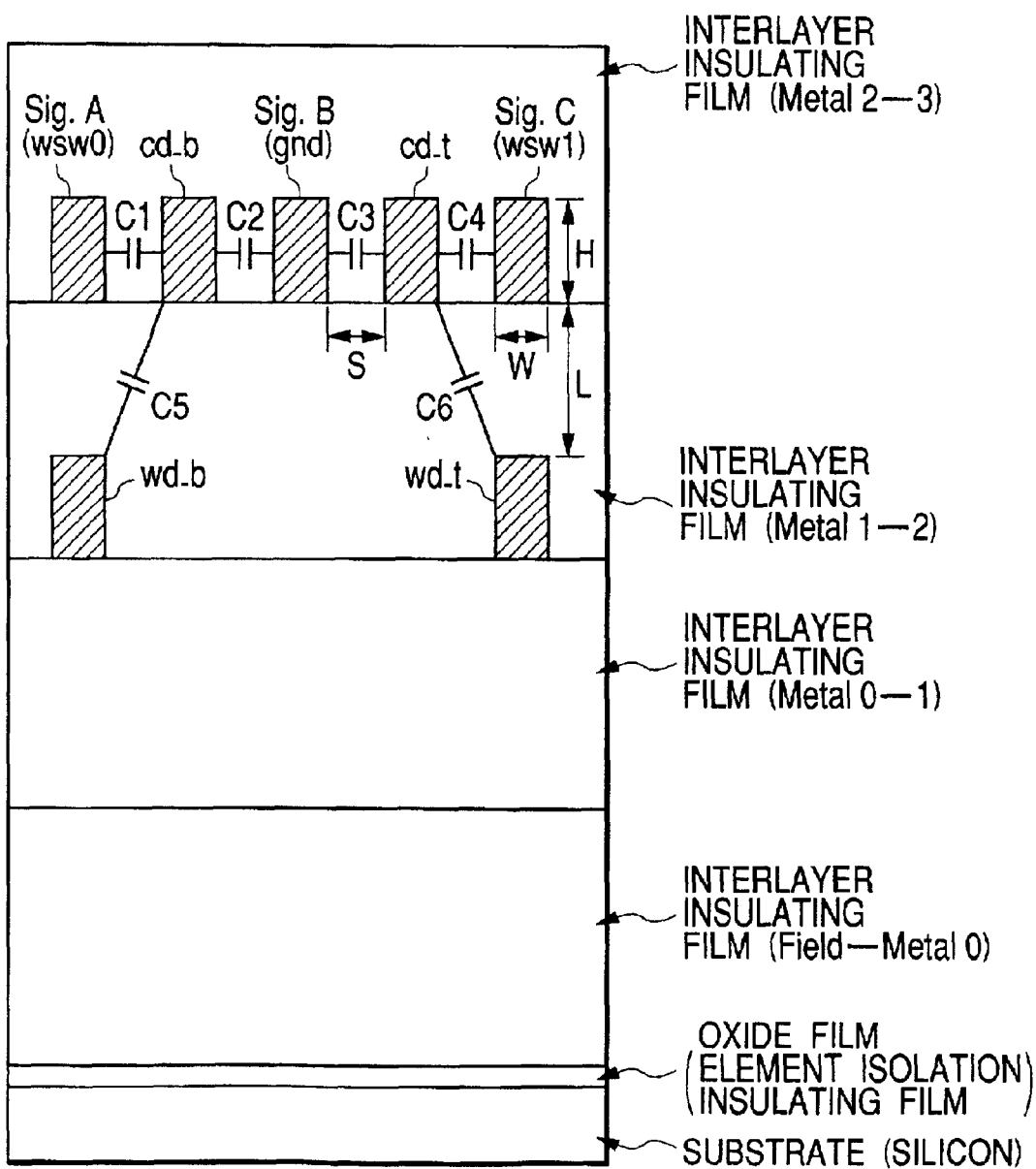
FIG. 4 is a sectional view taken on line A–A' in the embodiment in FIG. 3.

FIG. 4 illustrates a section taken on line A–A' in FIG. 3. Interlayer insulating films are formed between different wiring layers and between the wiring layers on the same layer. The surface of each interlayer insulating film is flattened, for example, by the CMP (Chemical Mechanical Polishing). In this embodiment, the wiring width W and wiring spacing S comply with a producible minimum. In the wiring processing with the minimum-processing dimension, the wiring thickness (height) H becomes increased against the wiring width W. The film thickness L of the interlayer insulating film (interlayer film) becomes increased compared with the wiring spacing S and the wiring height H.

Here, the film thickness L of the interlayer film is the film thickness between the lower-layer wiring (wd_t) and the upper-layer wiring (Sig. C) located right above it. Making the wiring width W smaller than the wiring height H in this manner will reduce the wiring spacing to enhance the wiring density, and will lower the wiring resistance. Making the film thickness L of the interlayer film greater than the wiring width W and the wiring height H will lower the coupling capacitance between the wiring layers.

Taking advantage of the distinctive feature in the processing dimension of the semiconductor integrated circuit, this embodiment allocates, in order to reduce the coupling noise, the data lines cd_b and cd_t for reading being the noise receiving wiring on a different wiring layer from where the data lines wd_b and wd_t for writing being the noise source are laid out, and thereby attains lowering parasitic capacitances C5 and C6 by utilizing the feature that the film thickness L of the interlayer film is the largest and the wiring width W is the smallest. Further, the layout of the data lines cd_b and cd_t for reading and the data lines wd_b and wd_t for writing is made not to overlap them in the vertical direction, but to shift the data lines wd_b and wd_t for writing by one pitch outside the data lines cd_b and cd_t for reading. This arrangement further increases the wiring spacing between the wiring as the noise source and the wiring receiving the noise, thereby reducing the parasitic capacitances C5 and C6.

In addition to this, to reduce the influence of the noises transmitted by the parasitic capacitances C5 and C6, the signal lines Sig. A (wsw0) and Sig. C (wsw1) being stabilized to the specific voltage at the noise generating point are laid out to the data lines cd_b and cd_t for reading as the wiring receiving the noise. This configuration makes it possible to form parasitic capacitances C1, C4 between the data line cd_b and the signal line Sig. A (wsw0), and between the data line cd_t and the signal line Sig. C (wsw1). Since there are the foregoing dimensional relations between the wiring spacing S, wiring height H, wiring width W, and film thickness L, the parasitic capacitances C1, C4 can be made greater than the parasitic capacitances C5, C6.

Thus, it is possible to reduce the coupling noises by forming the parasitic capacitances C5, C6 small to thereby lower the transmitting noises themselves, and by making the parasitic capacitances C1, C4 absorb the transmitted noises, without sacrificing the operation speed in the high density, or without sacrificing the high integration of the signal wirings. The signal line Sig. A (wsw0) and the signal line Sig. C (wsw1) are brought into a constant potential of the low level, at the noise generating point, in case of the column selection signal for writing, and they can bear the function to reduce the noises accordingly.

When the dummy line Sig. B is laid out between the data line cd_b and the data line cd_t for reading, and a constant voltage such as the ground potential gnd is supplied to the dummy line Sig. B, parasitic capacitances C2 and C3 can be formed on each of the inner sides between the dummy line Sig. B and the data line cd_b, and between the dummy line Sig. B and the data line cd_t. These parasitic capacitances C2 and C3 are formed in parallel to the parasitic capacitances C1, C4, which increase the self-capacitances of the data lines cd_b and cd_t for reading and expand the function to reduce the noises. When the lengths of the dummy line Sig. B and the signal lines Sig. A (wsw0) and Sig. C (wsw1) adjoining in parallel to the data lines cd_b and cd_t for reading are made equal, for example, to establish one dummy line will double the self-capacitances to reduce the noises.

When the output of the comparison circuit shows non-coincidence as above, the signal line Sig. A (wsw0) or the Sig. C (wsw1) varies from the low level to the high level with the full amplitude. In this period, the coupling noises are to be transmitted to the data lines cd_b and cd_t for reading through the parasitic capacitances C1, C4, however the data lines cd_b and cd_t for reading are stabilized to the high level/low level by the latch circuits constituting the sense amplifier, which does not offer any problems.

A microprocessor with a cache memory built in, especially the one used for portable electronic equipment is premised on a battery drive. Therefore, low power consumption is very important in order to extend the battery life, and to make the lower limit operational voltage as low as possible is also important. Accordingly, when the circuit was operated with a low voltage of 1.2 through 1.6 volts, it became clear that there was a possibility of creating a malfunction especially at the low voltage. As the result of detailed examinations made on this malfunction, it was confirmed that the cause lies in the interferences of signals by the parasitic capacitances C5, C6.

That is, the data lines cd_b and cd_t for reading being the fine potential difference input signal lines for the sense amplifier that amplifies the fine potential difference of the memory cells are brought into the floating state after completing the pre-charge before starting the sensing. Then, as the read request data serving both as the write data are inputted to the data lines wd_b and wd_t for writing with the full amplitude, the electrical interferences by the parasitic capacitances C5, C6 bring to the data lines cd_b and cd_t for reading before starting the sensing a reverse potential difference against the normal potential difference corresponding to the information stored in the memory cell now being selected. The reverse potential difference is amplified straight by the sense amplifier, thus creating a malfunction.

The sense amplifier employs the CMOS latch circuit in order to reduce the power consumption, in which the amplifying operation is controlled by the timing signal. The CMOS latch circuit performs a high-sensitive signal amplification by means of the positive feedback function, acquires a signal of such a large amplitude as the CMOS level. Such an expansion of the signal amplitude will deter the direct current from flowing, which reduces the power consumption. In comparison with a static type sense amplifier using a differential amplifier that flows a steady-state bias current (direct current), the CMOS latch circuit will save a conversion circuit that converts a small amplitude signal in the differential circuit into a large amplitude as the CMOS level, which simplifies the circuit configuration and attains a great reduction of the power consumption.

However, if the sense amplifier is activated with the input signal level being insufficient, or with the input signal being incorrect, it will fall into an unrecoverable state because of the positive feedback loop; accordingly, the control of the activation timing thereof becomes important.

Incidentally, it is conceivable to delay the activation timing for the sense amplifier and wait until the potential difference corresponding to the information stored in the memory cell appears to the data line pair cd_b, cd_t for reading, but this will delay the operation speed. It is also conceivable to delay the input of the write data, but it will delay the operation speed as well. In contrast to these, the present invention will not sacrifice the operation speed as mentioned above, or will not increase the wirings in order to reduce the coupling noises.

Figure 5:
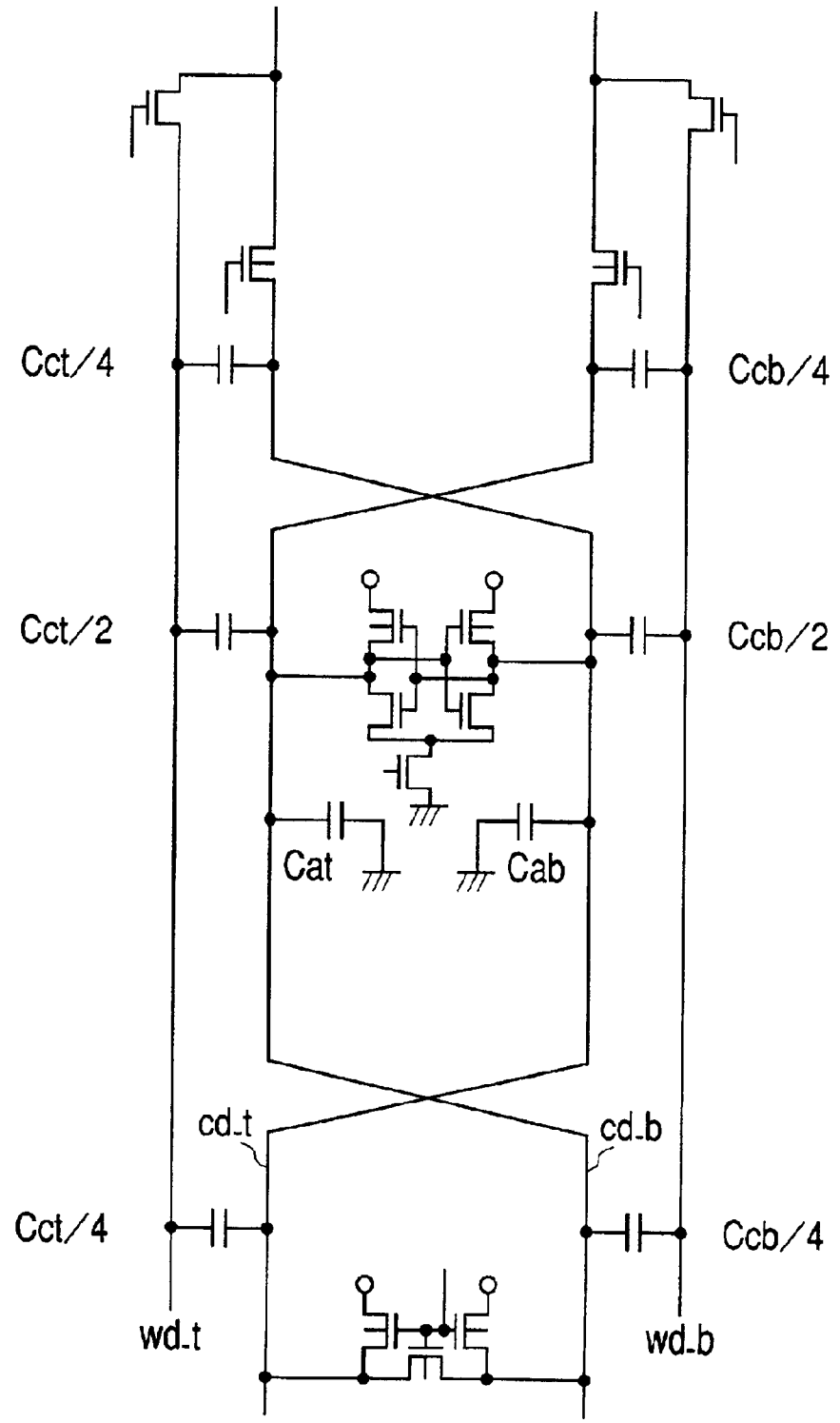
FIG. 5 is a circuit diagram illustrating another embodiment of the data lines for writing and the data lines for reading in FIG. 1.

FIG. 5 illustrates a circuit diagram of another embodiment relating to the write data lines and the read data lines. This embodiment improves the aforementioned embodiment, aiming at further higher integration of the circuit and further lowering of the supply voltage, and cancels by a circuital measure the interferences that the data lines wd_b and wd_t for writing affects to the data lines cd_b and cd_t for reading. This embodiment crosses the data lines cd_b and cd_t for reading provided inside to thereby create parasitic capacitances on both sides of the data lines wd_b and wd_t for writing.

For example, the whole length of the data lines wd_b and wd_t for writing extended in parallel to the data lines cd_b and cd_t for reading is divided into four equal parts, the data lines cd_b and cd_t for reading are crossed at the point of a quarter length thereof, and again they are crossed at the point of three quarter length thereof. Thereby, one data line cd_t has the parasitic capacitance of Cct/4+Cct/4 to the data line wd_t for writing and the parasitic capacitance of Ccb/2 to the data line wd_b for writing. On the other hand, the other data line cd_b has the parasitic capacitance of Cct/2 to the data line wd_t for writing and the parasitic capacitance of Ccb/4+Ccb/4 to the data line wd_b for writing.

Since the wiring length extended in parallel to each other is made equal by half, Cct/4+Cct/4Ccb/2 and Cct/2=Ccb/4+Ccb/4 are met. The write data with the full amplitude that are supplied to the data lines wd_b and wd_t for writing give the same amount of interferences to the data lines cd_b and cd_t for reading, with the halves thereof each being in reverse phase to each other, and the differential sense amplifier cancels the interferences. Thereby, a more stabilized reading operation can be attained by means of the reduction of parasitic capacitances and the increase of self-capacitances on the noise receiving wirings.

Figure 6:
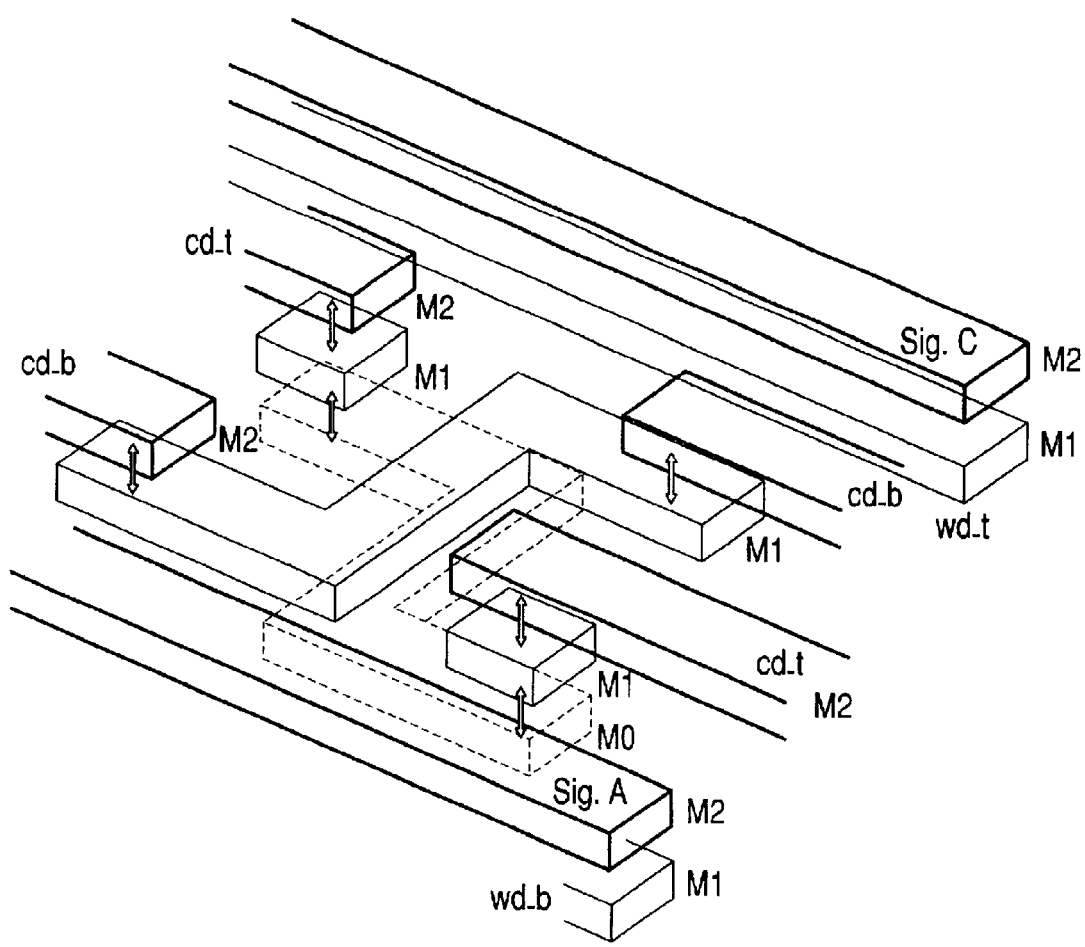
FIG. 6 is a schematic perspective view illustrating one embodiment of a crossing wiring area of the data lines for reading in FIG. 5.

FIG. 6 is a schematic perspective view of one embodiment relating to a crossing area of the data lines for reading. Since it lays out the dummy line Sig. B on the central area as mentioned above, this embodiment makes the crossing of the wirings formed on the wiring layer M2, using the lower wiring layers M1 and M0, which is not especially restricted. That is, the data line cd_b is connected to the opposite wiring layer M2 by means of the lower wiring layer M1. On the other hand, the data line cd_t is connected to the wiring layer M0 located below the lower wiring layer M1 with intervention of the wiring layer M1, and is connected to the opposite wiring layer M2 with intervention of the layer M1 through the wiring layer M0. When the dummy line Sig. B is omitted, or when the dummy line Sig. B is cut off at the crossing area and the ground potential of the circuit is supplied to each, the wiring layers M1 and M2 are made crossed.

According to the aforementioned embodiments, even when the mutual spacings between metal wirings in the manufacturing process are unexpectedly narrowed in order to increase the accessing speed, the relation between the parasitic capacitances C1, C4 and C5, C6 that are formed in correspondence with the ratio of the distances and the ratio of areas can be maintained, whereby the normal read operation of the memory circuits becomes possible. That is, focusing on the wiring receiving the noise, and arranging the second signal line that is maintained to a specific voltage at the timing of the foregoing small amplitude signal being transmitted to the wiring formed adjacently on the same layer as the former with the minimum processing dimension will enable the layout designing of the circuit without paying any considerations for the signals as the noise source. That is, to follow the rules as mentioned above will guarantee a uniform characteristic disregarding the technical levels of the designers, which facilitates the layout designing of the circuit and reduces the man-hour for the designing.

Figure 7:
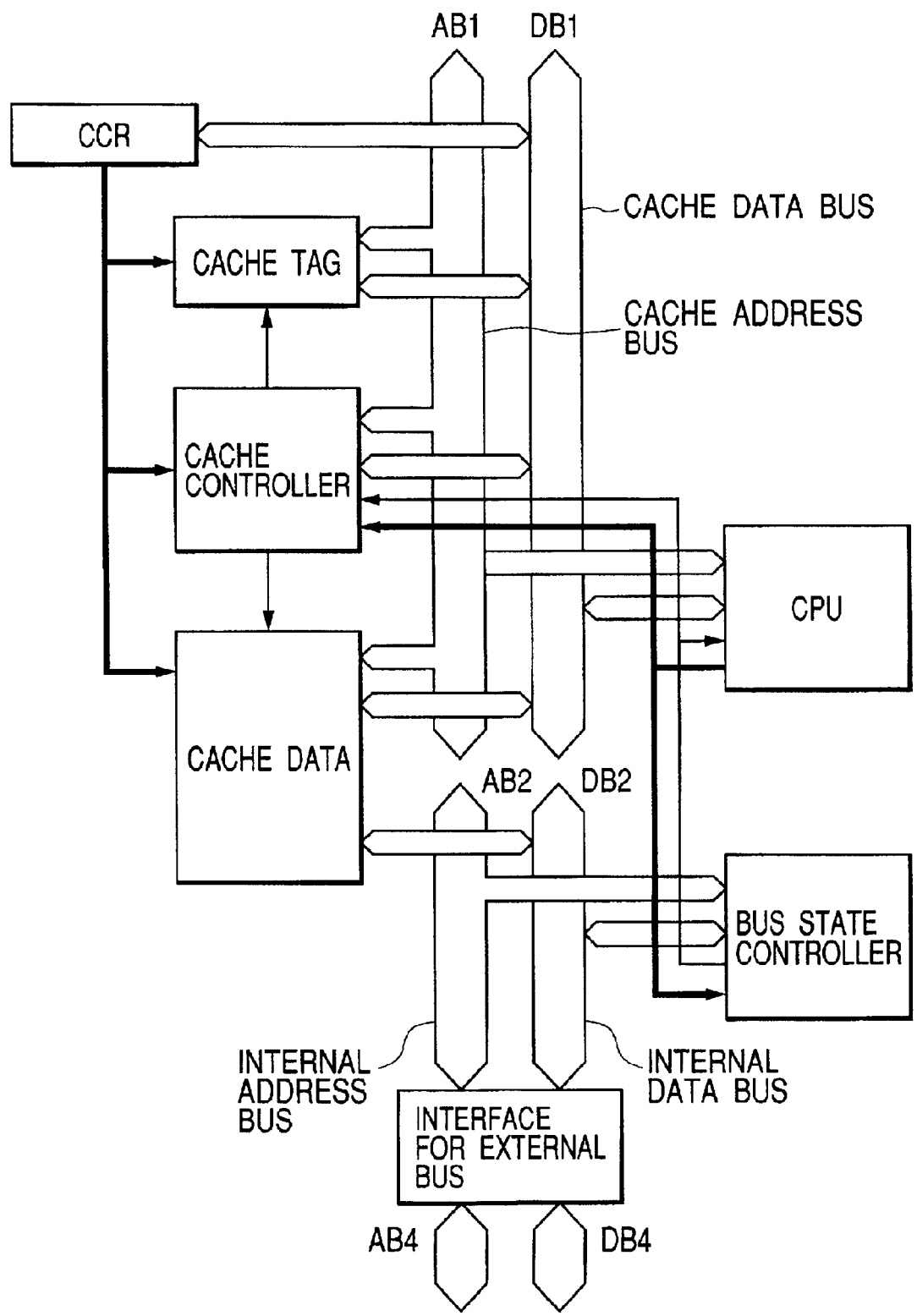
FIG. 7 is a block diagram illustrating one embodiment of a single chip microcomputer having a cache memory built in, to which the invention is applied.

FIG. 7 illustrates a block diagram of one embodiment relating to a single chip microcomputer having a cache memory built in, to which the invention is applied. The cache memory of this embodiment executes the output of a concerned data from the address input in one cycle. The replacing algorithm of data takes on the LRU (Least Recently Used) method, which is not especially limited.

Broadly speaking, the circuit configuration of the cache memory includes a cache tag (address array), cache data (data array), and a cache controller. The cache tag stores a part of addresses called the address tag, and the cache data stores data corresponding to the address tag stored in the cache tag.

If the part of addresses stored in the cache tag is coincident with the address corresponding to that from the central processing unit CPU, the cache tag outputs the hit signal, and the data selected in parallel, read out from the cache data, are taken in the CPU. If it is a mishit, the external main memory is to be accessed through the break control UBC and the external bus interface.

The cache control register CCR possesses the control bits such as cache enable, instruction fill inhibit, data fill inhibit, way designation, etc., which are used for setting the operation mode.

The operational concept of the cache memory to which the invention is applied is as follows in rough. For example, the address signal is composed of 32 bits of A31 through A0. One line is composed of 16 bytes corresponding to 4 bits of the address A3 through A0. The line is a lump of data associated with one associated address. The address signal possesses 64 entries by 6 bits of A9 through A4. The address signal of 19 bits from A28 through A10 is written in the cache tag as the tag address. The three bits of the address signal from A31 through A29 are used for designating an accessed space.

The LRU information is provided which correspond with the 64 entries from 0 through 63. The LRU information is composed of 6 bits. The information relating to the past accesses, used for the determination of the LRU replacement is expressed by 6 bits. There are 64 combinations, which can be expressed by 6 bits; however, 24 combinations with the initial value being zero are used. The combination is made for utilization when the LSB is used for the two ways. When the two ways out of the four ways are used for the built-in RAM, the way 3 is used for the replacement by a mishit, if the LSB is 0; and the way 2 is used, if it is 1. The LRU information in the four-way mode are rewritten according to the 24 combinations that satisfy these conditions mentioned above.

When the tag address read out from the cache tag coincides with the address signal of 19 bits from A28 through A10 outputted from the CPU, and the valid bit is 1, the cache tag outputs a hit signal and the cache data outputs a data of 16 bytes. The 4 bytes (32 bits) out of the 16 bytes are designated by the addresses A3 and A2 of 2 bits, and are read out to the CPU.

Figure 8:
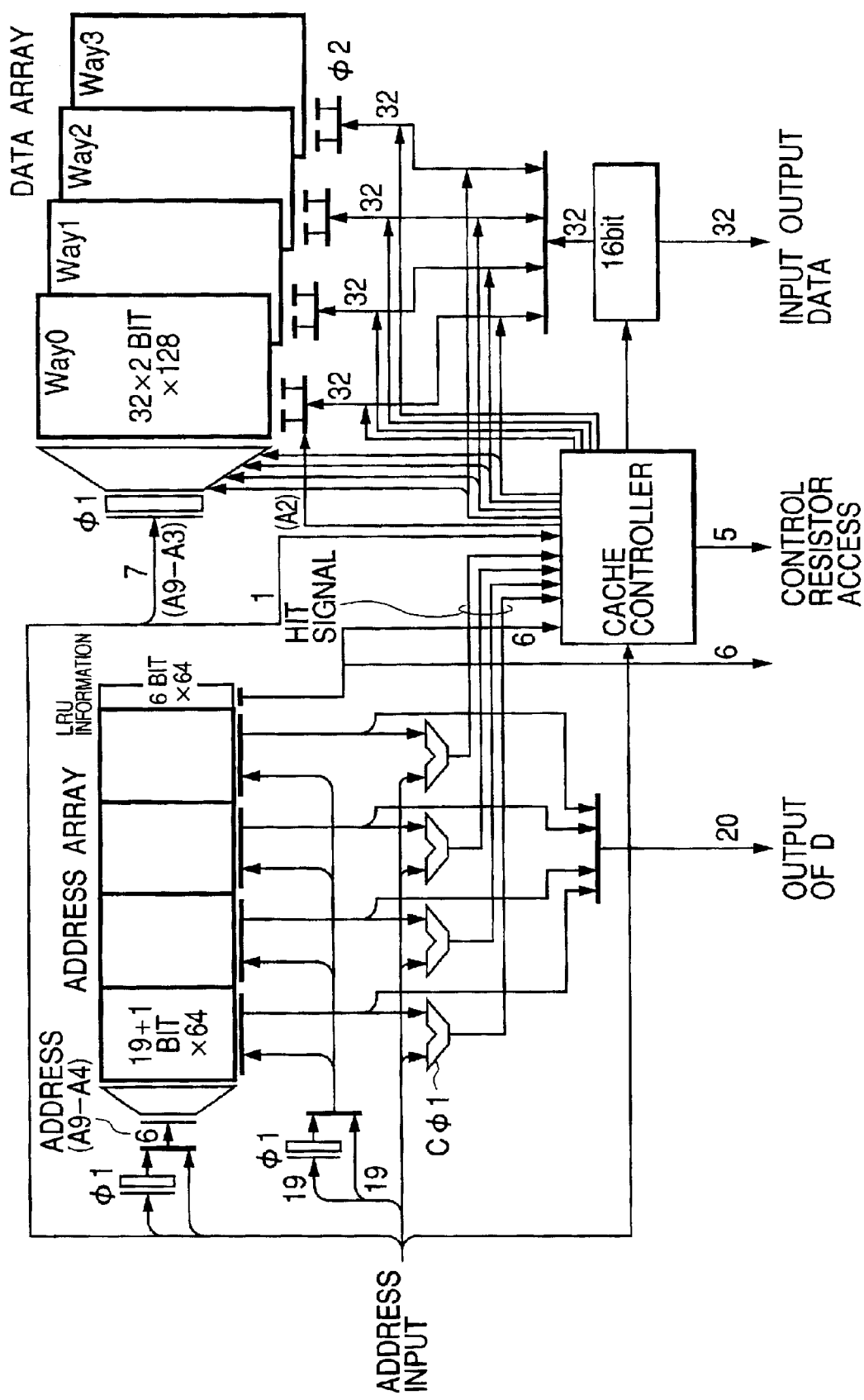
FIG. 8 is a block diagram illustrating one embodiment of a cache memory to which the invention is applied.

FIG. 8 illustrates a block diagram of one embodiment relating to a cache memory to which the invention is applied. The cache tag includes a decoder, address array, and comparator C. The address array is composed of four portions corresponding to the four ways as mentioned above, and receives the address input of A9 through A4, and selects one out of 64 entries. As for each entry, the address signal of 19 bits corresponding to the address tag and the valid bit of 1 bit are to be stored. Accordingly, in regard to the address array corresponding to one way, (19+1) bit×64 are stored. The storage units for the LRU information of 6×64 are provided commonly in correspondence with the four ways.

Because the CPU outputs address signals by the pipeline operation, the latch circuit holding the address signals by the pulse Ø1 is used in order to store the address at the moment of a mishit. The address tags read out from the address array and the address signals A28 through A10 of 19 bits corresponding to the address input are inputted to the comparators C.

The hit signals in the four comparators C provided in correspondence with the four ways are supplied to the cache controller. The LRU information corresponding to a selected entry out of 64 entries is supplied to the cache controller. If any hit signal is not outputted from the four ways, the one way to be used for replacement is determined by the above LRU information. The address tags read out from the address array are outputted as the diagnosis data D through a selector.

The address signals of 7 bits composed of the address signals A9 through S3 of the address input are inputted to the decoder of the data array. The data array is composed of 32 bits×2×128. The address signals A9 through A4 correspond to the 64 entries. The address signal A3 is made to select the data of the upper 32×2 bits, or the data of the lower 32×2 bits out of the one line (32×4). In this manner, to make the configuration of the data array longitudinally long will reduce the number of the complementary data lines, and facilitate to output the data with a unit composed of 32 bits.

In this embodiment, the cache controller inputs a hit signal to the decoder of the data array, although it is not especially limited. Thereby, the decoder executes the selection operation of the word line only to the way corresponding to the hit signal out of the four ways, thus reducing the power consumption. Further, the decoder operates only the sense amplifier of the data array corresponding to the hit signal. It is conceivable to use the hit signal only for the control of the sense amplifier, because the power consumption in the sense amplifier is comparably high. In other words, the decoder of the data array may be arranged such that it puts the word lines of the four ways into the selection state for a high speed reading, precedes the reading operation from the memory cell, awaits the hit signal to put the sense amplifier into operation, and enhances the reading speed from the data array. As for the data of 32×2 bits read out from the way corresponding to the hit signal, the data of 32 bits are outputted through the selector selected by the address signal A2 that has been outputted through the cache controller.

The comparator of the address tag operates by the timing signal Ø1. The inverted signal of the sense amplifier activation signal sa that controls the gate circuits G1 and G2 in FIG. 1 is generated in correspondence with the timing signal Ø1. In contrast to this, the output selector of the data array is made to operate by the timing signal Ø2 that is delayed by the half cycle against the timing signal Ø1. Therefore, it is possible to execute the word line selection of the data array and the control of the sense amplifier by the hit signal without any problems. An aligner furnished with the out put unit is used for outputting the data in a unit of 8 bits or 16 bits in correspondence with the output data width.

Figure 9:
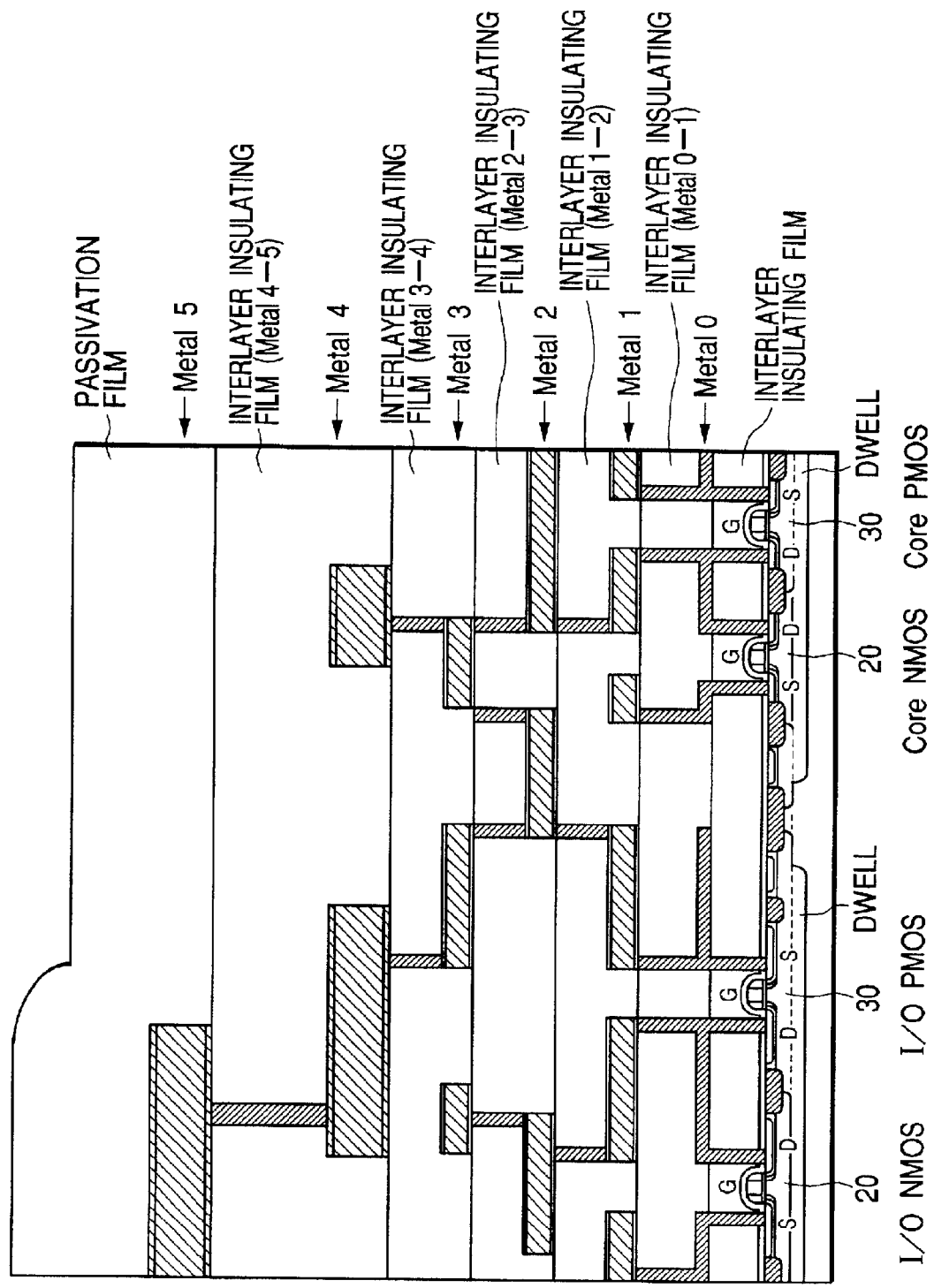
FIG. 9 is a schematic sectional view illustrating one embodiment of a semiconductor integrated circuit device relating to the invention.

FIG. 9 illustrates a schematic section of one embodiment of a semiconductor integrated circuit device relating to the invention. As an example, this is intended for a single chip microcomputer incorporating a high-speed static type RAM as the cache memory illustrated in FIG. 7.

This embodiment forms Core PMOS (P-channel type MOSFET) and Core NMOS (N-channel type MOSFET) for the memory cells, and the similar PMOS and NMOS for the input/output I/O on the semiconductor substrate 10. The diffusion layer (semiconductor region) for the source S and drain D of these NMOS is formed on the P-type well region 20 illustrated by the solid lines that is formed on the N-type well region DWEEL with a deep depth. The diffusion layer for the source S and drain D of these PMOS is formed on the N-type well region 30 illustrated by the dotted lines that is formed on the N-type well region DWEEL with the deep depth.

The MOSFET gates are formed with a thin gate insulating film that is formed on the semiconductor substrate between the source S and the drain D. The gate electrodes are formed with a conductive poly silicon layer, which is not especially limited. The wirings connected to the gate G, source S, and drain D of the MOSFET are made up with the multi-layer wirings composed of 6 layers of the metal wirings Metal0 to 5. Although not especially restricted, the Metal0 is the 0-layer wiring, the wiring layer having tungsten as the principal component, being a metal layer that permits a fine processing, which is used for a local wiring of a short wiring length for forming a small-sized circuit such as a memory cell.

The wirings of five layers of the metal wirings Metal1 to 5 are, although not especially restricted, metal films, for example, the wiring layers having aluminum as the principal component, and they are used for the data line for writing, the data line for reading, the power supply line, and the like. Or, in the single chip microcomputer system, they are used in forming comparably long wirings such as the cache address bus, cache data bus, internal address bus, internal data bus, etc. In case of increasing the wiring length, increasing the wiring width decreases the parasitic resistances, and thereby increases the transmission speed of the signal. Between the metal wiring layers Metal0 to 5 are formed, for example, interlayer insulating films. The surface of each interlayer insulating film is flattened by a polishing method such as the CMP.

The data line for reading that connects the column selection circuit with the sense amplifier of the memory circuit, and the data line for writing that connects the write amplifier with the column selection circuit have comparably short wiring lengths, and they are formed with the metal wiring Metal1 or Metal2 at the minimum wiring pitch.

The aforementioned embodiments display the following effects and functions.

(1) Laying out, to a first signal line to which a signal with a comparably small amplitude against a power supply voltage is transmitted at a first timing, a second signal line to which a voltage maintained at a constant is transmitted at the first timing, on the same wiring layer as that of the first signal line adjacently to each other reduces the coupling noises without impairing a high density of the signal wirings.

(2) In addition to the above, providing a latch type amplifier that amplifies the signal with the small amplitude transmitted to the first signal line in correspondence with the first timing into the signal amplitude corresponding to the power supply voltage and the ground potential of the circuit achieves a high-speed operation and low power consumption.

(3) In addition to the above, further providing a third signal line in which a signal change is generated between the power supply voltage and the ground potential of the circuit in correspondence with the first timing, and forming the third signal line on a wiring layer different from that on which the first and second signal lines are formed reduces the coupling noises with achieving a high density of the signal wirings.

(4) In addition to the above, by the first, second, and third signal lines each including parts extended in parallel to each other, the coupling noises can be reduced with attaining a high density of the signal wirings.

(5) In addition to the above, making the wiring width of the first through third signal lines narrower than the wiring height reduces the coupling noises with a high-density wiring arrangement at the minimum processing dimension.

(6) In addition to the above, laying out the parts extended in parallel of the first and third signal lines with wiring pitches shifted in the perpendicular direction to the extending direction thereof reduces the coupling noises effectively.

(7) In addition to the above, laying out the second signal line on one side of the first signal line, and laying out a fourth wiring line having a specific voltage fixedly supplied on the other side of the first signal line realizes a sharp reduction of the coupling noises with a minimum increase of the wirings.

(8) Laying out plural static type memory cells on the intersections of the plural word lines and plural complementary bit line pairs, connecting the complementary bit line pair to complementary signal line pair for writing by a first selection switch circuit, connecting the complementary bit line pair to complementary signal line pair for reading by a second selection switch circuit, connecting a sense amplifier including a latch circuit, of which input and output are coupled to the complementary signal line pair for reading, which is activated by an operational timing signal, laying out a specific signal line to which a voltage maintained at a constant is transmitted during an amplifying operation of the sense amplifier, from when information stored in the memory cells are transmitted to the signal line pair for reading through the second selection switch circuit, and laying out the signal line pair for reading and the specific signal line on one and the same wiring layer adjacently to each other attains a memory circuit that realizes a high integration, low power consumption, and high speed.

(9) In addition to the above, using the specific signal line as a signal line that transmits a selection signal to the first selection switch circuit realizes a high density of the wirings.

(10) In addition to the above, transmitting a write signal to the signal line pair for writing in parallel to an operation in which information stored in the memory cells are transmitted to the signal line pair for reading through the second selection switch circuit realizes a high-speed writing corresponding to a readout result.

(11) In addition to the above, allocating two complementary bit line pairs to the one complementary signal line pair for reading and signal line pair for writing, and allocating one sense amplifier and write amplifier to each of the one complementary signal line pair for reading and signal line pair for writing implements a high integration of the memory circuit.

(12) In addition to the above, laying out one signal line pair of the complementary signal line pair for writing and the complementary signal line pair for reading on the outside, and the other signal line pair on the inside, and providing a crossing area in a manner that one of the complementary signal line pair provided on the inside has parasitic capacitances to both of the complementary signal line pair on the outside, and the other one of the complementary signal line pair provided on the inside has parasitic capacitances to both of the complementary signal line pair on the outside cancels a transmission of the coupling noises.

Although the invention has been described concretely according to the embodiments, it is not limited to the embodiments, and naturally various modifications and changes will be possible without departing the scope and spirit thereof. For example, a layout is possible which sandwiches an interlayer insulating film between the data lines wd_b and wd_t for writing and the data lines cd_b and cd_t for reading. Also in this case, when the wirings are formed with the minimum pitch, the relation of w<H<L is satisfied, and the relation of C5<C1(C6<C4) is also maintained. Moreover, when the dummy line Sig. B is provided, C2 (C3) is added further on the C1 (C4), and the coupling noises can be reduced accordingly.

Further, it may be arranged to form the data lines wd_b and wd_t for writing by using the wiring layer M2 and the data lines cd_b and cd_t for reading by using the wiring layer M1. Or, they may be formed with a combination of the other wiring layer M3 and the layer M2. This invention can be utilized, other than the address array in the cache tag or the cache memory, for a parallel function that executes the reading and writing of data stored in a memory circuit at the same time. For example, in the semiconductor integrated circuit device such as the single chip microcomputer, the signal paths handling small amplitude signals or the signal paths transmitting analog signals such as an A/D converter or a D/A converter receive great influences of noises, and applying this invention will reduce the noises.

The effects achieved by the typical claims of the invention disclosed here are as follows.

Laying out, to a first signal line to which a signal with a comparably small amplitude against a power supply voltage is transmitted at a first timing, a second signal line to which a voltage maintained at a constant is transmitted at the first timing, on the same wiring layer as that of the first signal line adjacently to each other reduces the coupling noises without impairing a high density of the signal wirings.

Laying out plural static type memory cells on the intersections of the plural word lines and plural complementary bit line pairs, connecting the complementary bit line pair to complementary signal line pair for writing by a first selection switch circuit, connecting the complementary bit line pair to complementary signal line pair for reading by a second selection switch circuit, connecting a sense amplifier including a latch circuit, of which input and output are coupled to the complementary signal line pair for reading, which is activated by an operational timing signal, laying out a specific signal line to which a voltage maintained at a constant is transmitted during an amplifying operation of the sense amplifier, from when information stored in the memory cells are transmitted to the signal line pair for reading through the second selection switch circuit, and laying out the signal line pair for reading and the specific signal line on one and the same wiring layer adjacently to each other attains a memory circuit that realizes a high integration, low power consumption, and high speed.

What is claimed is:

1. A semiconductor integrated circuit device comprising:
    a first signal line;
    a second signal line maintained at a specific voltage, at a first timing that a signal with a small amplitude in comparison with a signal amplitude corresponding to a power supply voltage and a ground potential of a circuit is transmitted to the first signal line; and
    a third signal line in which a signal change is generated between the power supply voltage and the ground potential of the circuit, in correspondence with the first timing,
    wherein the first signal line and the second signal line are laid out on an identical wiring layer adjacently to each other, and
    wherein the third signal line is formed on a wiring layer different from that on which the first and second signal lines are formed.

2. A semiconductor integrated circuit device according to claim 1, further comprising a latch type amplifier that amplifies the signal with the small amplitude transmitted to the first signal line in correspondence with the first timing into the signal amplitude corresponding to the power supply voltage and the ground potential of the circuit.

3. A semiconductor integrated circuit device according to claim 1, wherein the first through third signal lines have a narrower wiring width than a wiring height.

4. A semiconductor integrated circuit device according to claim 1, wherein parts extended in parallel of the first and third signal lines are laid out with wiring pitches shifted in the perpendicular direction to the extending direction thereof.

5. A semiconductor integrated circuit device according to claim 1, wherein the second signal line is laid out on one side of the first signal line, and a fourth wiring line having a specific voltage fixedly supplied is laid out on the other side of the first signal line.

6. A semiconductor integrated circuit device comprising:
    a plurality of word lines and a plurality of complementary bit line pairs;
    a plurality of static type memory cells provided on intersections of the plurality of word lines and plurality of complementary bit line pairs;
    a first selection switch circuit that connects a complementary bit line pair to a complementary signal line pair for writing,
    a second selection switch circuit that connects the complementary bit line pair to a complementary signal line pair for reading,
    a sense amplifier including a latch circuit, of which input and output are coupled to the complementary signal line pair for reading and which is activated by an operational timing signal;

a specific signal line to which a voltage maintained at a constant is transmitted during an amplifying operation of the sense amplifier, from when information stored in the memory cells are transmitted to the complementary signal line pair for reading through the second selection switch circuit; and a memory circuit in which the complementary signal line pair for reading and the specific signal line are laid out on an identical wiring layer adjacently to each other.

7. A semiconductor integrated circuit device according to claim 6, wherein the specific signal line is a signal line that transmits a selection signal to the first selection switch circuit.

8. A semiconductor integrated circuit device according to claim 7, wherein a write signal is transmitted to the complementary signal line pair for writing in parallel to an operation in which information stored in the memory cells are transmitted to the complementary signal line pair for reading through the second selection switch circuit.

9. A semiconductor integrated circuit device according to claim 8, wherein two complementary bit line pairs are allocated to the complementary signal line pair for reading and the complementary signal line pair for writing, and wherein one sense amplifier and write amplifier are provided to each of the one complementary signal line pair for reading and the complementary signal line pair for writing.

10. A semiconductor integrated circuit device according to claim 9, wherein one signal line pair of the complementary signal line pair for writing and the complementary signal line pair for reading is laid out on the outside, and the other complementary signal line pair is laid out on the inside, and wherein a crossing area is provided in a manner that one of the complementary signal line pair provided on the inside has parasitic capacitances to both of the complementary signal line pair on the outside, and the other one of the complementary signal line pair provided on the inside has parasitic capacitances to both of the complementary signal line pair on the outside.

11. A semiconductor integrated circuit device comprising:

a first signal line;

a second signal line maintained at a specific voltage, at a first timing that a signal with a small amplitude in comparison with a signal amplitude corresponding to a power supply voltage and a ground potential of a circuit is transmitted to the first signal line; and a third signal line in which a signal change is generated between the power supply voltage and the ground potential of the circuit, in correspondence with the first timing, wherein the first signal line and the second signal line are laid out on an identical wiring layer adjacently to each other, wherein the third signal line is formed on a wiring layer different from that on which the first and second signal lines are formed, and wherein the first, second, and third signal lines each include parts extended in parallel to each other.

12. A semiconductor integrated circuit device according to claim 11, wherein the first, second, and third signal lines have a narrower wiring width than a wiring height.

13. A semiconductor integrated circuit device according to claim 12, wherein the parts extended in parallel of the first and third signal lines are laid out with wiring pitches shifted in the perpendicular direction to the extending direction thereof.

14. A semiconductor integrated circuit device comprising:

a first wiring to which a signal is transmitted;

a second wiring to which a power supply voltage or a ground potential of a circuit is supplied; and a third wiring to which a signal is transmitted, in which, at a first timing that a signal with a small amplitude in comparison with a signal amplitude corresponding to the power supply voltage and the ground potential of the circuit is transmitted to the first wiring, a signal change with a larger amplitude than the small amplitude is generated between the power supply voltage and the ground potential of the circuit, wherein the first wiring and the second wiring are laid out on an identical wiring layer adjacently to each other, wherein the third wiring is formed on a wiring layer different from that on which the first and second wirings are formed, and wherein the first, second, and third wirings each include parts extended in parallel to each other.

15. A semiconductor integrated circuit device according to claim 14, wherein the first, second, and third wirings have a narrower wiring width than a wiring height.

16. A semiconductor integrated circuit device according to claim 15, wherein the parts extended in parallel of the first and third wirings are laid out with wiring pitches shifted in the perpendicular direction to the extending direction thereof.

* * * * *